United States Patent [19]

Asazawa

[11] Patent Number: 5,150,076
[45] Date of Patent: Sep. 22, 1992

[54] EMITTER-GROUNDED AMPLIFIER CIRCUIT WITH BIAS CIRCUIT

[75] Inventor: Hiroshi Asazawa, Tokyo, Japan
[73] Assignee: NEC Corporation, Tokyo, Japan
[21] Appl. No.: 719,812
[22] Filed: Jun. 24, 1991

[30] Foreign Application Priority Data

Jun. 25, 1990 [JP] Japan .................................. 2-166117

[51] Int. Cl.$^5$ .............................................. H03F 1/30
[52] U.S. Cl. .................................. 330/296; 307/296.6
[58] Field of Search ......................... 307/296.1, 296.6; 33/127, 295, 296, 297, 290

[56] References Cited

U.S. PATENT DOCUMENTS

4,352,057  9/1982  Okada et al. ................... 330/296 X
4,583,051  4/1986  Bowers ............................ 330/296

OTHER PUBLICATIONS

Biopolar Monolithic Amplifiers For a Gigabit Optical Repeater, O'Hara, et al. IEEE Journal of Solid-State Circuits, vol. SC-19, No. 4, Aug. 1984, pp. 491–497.
0.5–2.6GHz Si-Monolithic Wideband Amplifier IC, Nakata, et al. IEEE 1985 MTT-S Digest, pp. 55–59.
Silicon Bipolar Fixed and Variable Gain Amplifier MMICs For Microwave and Lightwave Applications Up to 6GHz, Kipnis, et al., 1989, IEEE MTT-S Digest.

*Primary Examiner*—Steven Mottola
*Attorney, Agent, or Firm*—Laff, Whitesel, Conte & Saret

[57] ABSTRACT

An amplifier circuit has an amplifying transistor having its emitter directly grounded and a biasing transistor for supplying a bias current to the base of the amplifying transistor through its emitter. The biasing transistor receives at its base an output voltage generated and forwarded from a bias voltage generating circuit which is composed of a constant current source, a constant current transistor and another biasing transistor. One bias voltage generating circuit may provide its output voltage commonly to a plurality of biasing transistors each associated with the amplifying transistor. The circuit makes it possible to have the amplifying transistor operate at a desired operation point without using a resistor having a high resistance value. Further, since the emitter of the amplifying transistor is directly grounded, both the noise figure characteristics and high frequency characteristics are improved.

7 Claims, 2 Drawing Sheets

EMITTER-GROUNDED AMPLIFIER CIRCUIT WITH BIAS CIRCUIT

BACKGROUND OF THE INVENTION

The present invention relates to a transistor amplifying means and, more particularly, to an emitter-grounded high frequency amplifier circuit with a bias circuit.

A conventional amplifying means known as a voltage feedback type self-biasing circuit is diagrammatically shown in FIG. 1. As shown therein, a transistor $Q_1$ has its collector connected to a signal output terminal 12 and connected to a power source terminal 10 through a load 8, its emitter grounded, and its base connected to a signal input terminal 11 and also connected to its collector through a feedback resistor 30.

FIG. 2 is a circuit diagram showing another amplifying circuit known as a current feedback type self-biasing circuit. In this circuit, a voltage divided by serially-connected resistors 41, 42 is applied to the base of a transistor $Q_1$ as a bias voltage, and the current is fedback with the resistor 43 being connected to the emitter thereof. A capacitor 44 connected to the emitter is provided such that this emitter is grounded for AC components of an input signal applied at the input terminal 11.

In the conventional circuit shown in FIG. 1, the base-collector voltage is given by the product of the base current and the feedback resistance and, if this is small, the transistor operates in a condition which is close to a saturation state, which results in deterioration in high frequency characteristics. A way to prevent the transistor from becoming the saturation state is to increase a resistance value of the feedback resistor 30. For instance, for the collector-base voltage to be 2 V with the collector current being 5 mA and the base current being 50 $\mu$A, it is necessary for the resistance value of the feedback resistor 30 to be as high as 40 k$\Omega$. However, in the integrated circuit device, it is generally difficult to fabricate a resistor having such a high resistance value.

The conventional amplifier circuit shown in FIG. 2 involves disadvantages in that it requires an AC-bypass capacitor 44 and, since the emitter is grounded through the resistor 43 and the capacitor 44, high frequency characteristics and noise characteristics are inferior as compare with those obtained where the emitter is directly grounded.

SUMMARY OF THE INVENTION

It is, therefore, an object of the invention to overcome the problems existing in the conventional circuits and to provide an improved amplifier circuit.

It is another object of the invention to provide a biasing circuit which is capable of stably supplying a bias current to an emitter-grounded transistor of the amplifying stage of the amplifier circuit.

It is a further object of the invention to provide an amplifier circuit with an improvement in the noise characteristics and the higher frequency characteristics.

According to one aspect of the invention, there is provided an amplifier circuit having an input terminal, an output terminal and a power supply terminal, the circuit comprises:

an amplifying transistor having its base connected to the input terminal, having its collector connected to the output terminal and connected to the power supply terminal through a load, and its emitter grounded;

a first biasing transistor having its emitter connected to the base of the amplifying transistor, and its collector connected to the power supply terminal;

a bias voltage generating circuit including a constant current source; a constant current source transistor having its collector connected to the power supply terminal through the constant current source and having its emitter grounded; and a second biasing transistor having its base connected to the collector of the constant current source transistor and also connected to the base of the first biasing transistor, its emitter connected to the base of the constant current source transistor, and its collector connected to the power supply terminal.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Figure 1:
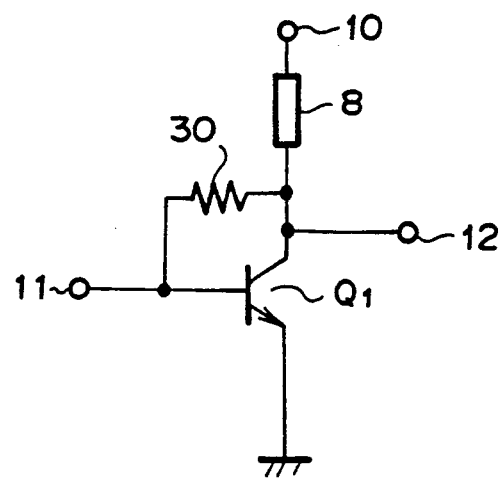
FIG. 1 is a circuit diagram showing an example of the prior art amplifier circuit.
Figure 2:
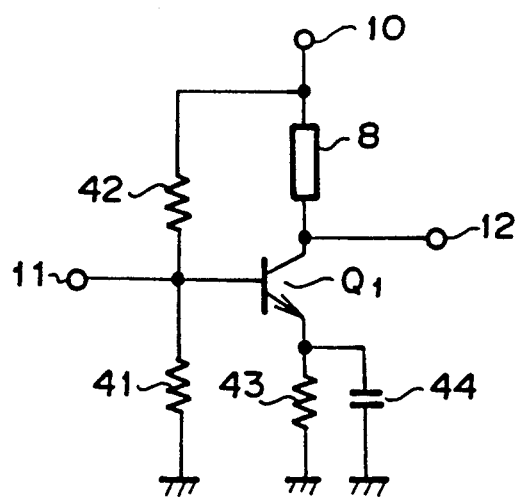
FIG. 2 is a circuit diagram showing another example of the prior art amplifier circuit.

Now, embodiments of the present invention are explained with reference to the appended drawings.

Throughout the following explanation, the same reference numerals or symbols refer to the same or like elements in all the figures of the drawings.

Figure 3:
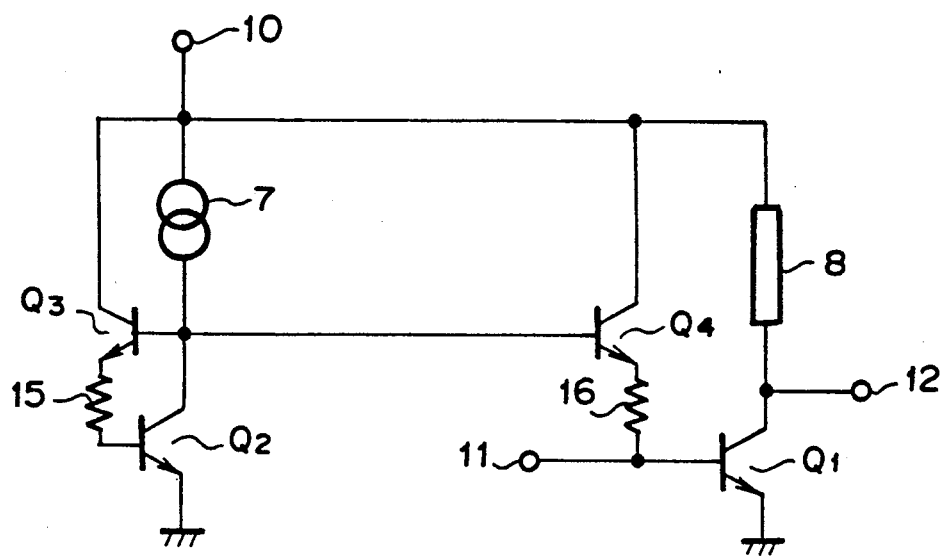
FIG. 3 is a circuit diagram showing a first embodiment according to the invention.

FIG. 3 is a circuit diagram showing a first embodiment according to the present invention. As shown therein, an amplifying transistor $Q_1$ has its base connected to a signal input terminal 11, its collector connected to a signal output terminal 12 and also connected to a power supply terminal 10 through a load 8, and its emitter grounded directly.

A bias voltage generating circuit is composed of a constant current source 7, transistors $Q_2$, $Q_3$ and an emitter resistor 15. An output voltage of this bias voltage generating circuit is taken out from the collector of the transistor $Q_2$ and is applied to the base of a biasing transistor $Q_4$. The biasing transistor $Q_4$ supplies a bias current to the base of the amplifying transistor $Q_1$ through an emitter resistor 16.

Here, assuming that, as an example, a size ratio between the transistors $Q_3$ and $Q_4$ and that between the transistors $Q_2$ and $Q_1$ are respectively 1:10 and a size ratio between the emitter resistors 15 and 16 is 10:1 (with layer resistances thereof assumed to be the same), the base-emitter voltage of the transistor $Q_2$ and that of the transistor $Q_1$ will be the same. In this case, if the current to flow in the transistor $Q_2$ is 1 mA, the current to flow in the transistor $Q_1$ will be 10 mA.

In the above example, the current flows in the amplifying transistor $Q_1$ is determined by both the size ratio of the respective transistors and the size ratio of the respective emitter resistors. However, it should be noted that it is possible to control the current to flow in the amplifying transistor $Q_1$ by varying only the size ratio of the transistors or only the size ratio of the resistors. Further, where the constant current source 7 is composed of a resistor only, the resistance values of such resistor may be changed for controlling the bias current.

In the circuit shown in FIG. 3, the emitter resistor 16 is provided for the purpose of reducing to the minimum an influence that the bias circuit may give to a signal circuit or signal line. However, where the circuit impedance of the transistor $Q_4$ seen from the signal input terminal 11 is sufficiently high as compared with the impedance of the signal circuit, the emitter resistor 16 may be omitted. The omission of the other emitter resistor 15 gives no influence on the signal circuit.

Figure 4:
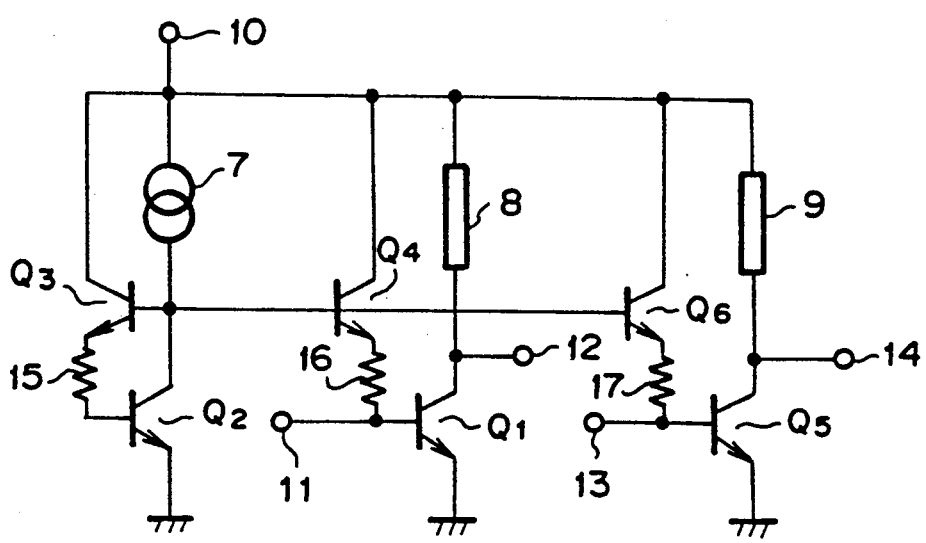
FIG. 4 is a circuit diagram showing another embodiment according to the invention.

FIG. 4 is a circuit diagram showing an amplifier circuit of a second embodiment according to the present invention. In this embodiment, the output voltage of only one bias voltage generating circuit composed of a constant current source 7, transistors $Q_2$, $Q_3$ and an emitter resistor 15 is applied to each of the bases of biasing transistors $Q_4$, $Q_6$ of a plurality of amplifying circuits. That is, besides the amplifying circuit shown in FIG. 3, there is provided in this arrangement an additional amplifying circuit composed of an amplifying transistor $Q_5$, a biasing transistor $Q_6$, an emitter resistor 17 and a load 9. The base and the collector of the amplifying transistor $Q_5$ are respectively connected to a signal input terminal 13 and a signal output terminal 14.

The current to be supplied by the bias voltage generating circuit to the biasing transistor only requires $1/h_{FE}$ of the base current of the amplifying transistor. Therefore, there is no problem in the circuit operation even where only one bias voltage generating circuit produces bias currents for a plurality of amplifying circuits as in the arrangement according to this second embodiment. In the case where this arrangement is realized in an integrated circuit device, a bias transistor may be disposed between the amplifying transistors and in this way it is possible to ensure the necessary isolation or separation between these amplifying transistors.

As explained above, the feature of the invention resides in the arrangement wherein the collector current of the biasing transistor which receives the output voltage from the bias voltage generating circuit as a base input is to be the base current of the amplifying transistor. Thus, it is possible to supply the bias current to the amplifying transistor as stably as in a current-mirror circuit configuration, and it is made possible to have the amplifying transistor operate at a desired operation point without using a resistor having a high resistance value such as in a conventional voltage feedback type amplifier circuit. Further, according to the present invention, since the emitter of the amplifying transistor is directly grounded, it is possible to improve the noise figure characteristics and the high frequency characteristics of the circuit.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. An amplifier circuit having an input terminal, an output terminal and a power supply terminal, said circuit comprising:

an amplifying transistor having its base connected to said input terminal, having its collector connected to said output terminal and connected to said power supply terminal through a load, and its emitter grounded;

a first biasing transistor having its emitter connected to the base of said amplifying transistor, and its collector connected to said power supply terminal;

a bias voltage generating circuit including a constant current source; a constant current source transistor having its collector connected to said power supply terminal through said constant current source and having its emitter grounded; and a second biasing transistor having its base connected to the collector of said constant current source transistor and also connected to the base of said first biasing transistor, its emitter connected to the base of said constant current source transistor, and its collector connected to said power supply terminal.

2. An amplifier circuit according to claim 1, which includes a resistor connected between the emitter of said first biasing transistor and the base of said amplifying transistor.

3. An amplifier circuit according to claim 1, which includes a resistor connected between the emitter of said first biasing transistor and the base of said amplifying transistor and a resistor connected between the emitter of said second biasing transistor and the base of said constant current source transistor.

4. An amplifier circuit having a plurality of input terminals, a plurality of output terminals and a power supply terminal, said circuit comprising:

a plurality of amplifying transistors each having its base connected to a respective input terminal, having its collector connected to a respective output terminal and connected to a respective power supply terminal through a load, and its emitter grounded;

a plurality of first biasing transistors each having its emitter connected to the base of a respective amplifying transistor, and its collector connected to said power supply terminal;

a bias voltage generating circuit including a constant current source; a constant source transistor having its collector connected to said power supply terminal through said constant current source and having its emitter grounded; and a second biasing transistor having its base connected to the collector of said constant current source transistor and also connected commonly to each of the bases of said plurality of first biasing transistors, its emitter connected commonly to the base of said constant current source transistor, and its collector connected to said power supply terminal.

5. An amplifier circuit having an input terminal, an output terminal and a power supply terminal, said circuit comprising:

a first transistor having its base connected to said input terminal, its collector connected to said output terminal and to said power supply terminal through a load, and its emitter grounded;

a second transistor having its collector connected to said power supply source through a constant current source and its emitter grounded;

a third transistor having its base and emitter respectively connected to the collector and the base of said second transistor and its collector connected to said power supply terminal; and a fourth transistor having its base connected to the collector of said second transistor, its collector connected to said power supply terminal, and its emitter connected to the base of said first transistor.

6. An amplifier circuit according to claim 5, which includes a resistor connected between the emitter of said fourth transistor and the base of said first transistor, or resistors each connected between the emitter of said fourth transistor and the base of said first transistor and between the emitter of said third transistor and the base of said second transistor.

7. An amplifier circuit according to claim 6, in which a size ratio between said third and fourth transistors and that between said second and first transistors are respectively m:n (m<n, and m, n being integers larger than 1) and a size ratio between said resistors is n:m.

* * * * *